US009766976B2

(12) United States Patent
d'Abreu et al.

(10) Patent No.: US 9,766,976 B2
(45) Date of Patent: Sep. 19, 2017

(54) DATA STORAGE DEVICE AND METHOD FOR STORING MULTIPLE CODEWORDS AND REDUNDANCY INFORMATION AT A WORD LINE

(71) Applicant: SANDISK TECHNOLOGIES INC., Plano, TX (US)

(72) Inventors: Manuel Antonio d'Abreu, El Dorado Hills, CA (US); Zongwang Li, Dublin, CA (US)

(73) Assignee: SanDisk Technologies LLC, Plano, TX (US)

( * ) Notice: Subject to any disclaimer, the term of this patent is extended or adjusted under 35 U.S.C. 154(b) by 79 days.

(21) Appl. No.: 14/733,184

(22) Filed: Jun. 8, 2015

(65) Prior Publication Data

US 2016/0357632 A1    Dec. 8, 2016

(51) Int. Cl.
  *G11C 29/00*   (2006.01)
  *G06F 11/10*   (2006.01)
  *H03M 13/29*   (2006.01)
  *G11C 29/52*   (2006.01)
  *G11C 16/34*   (2006.01)
  *G11C 29/04*   (2006.01)

(52) U.S. Cl.
  CPC ..... *G06F 11/1072* (2013.01); *H03M 13/2906* (2013.01); *H03M 13/2942* (2013.01); *G11C 16/349* (2013.01); *G11C 29/52* (2013.01); *G11C 2029/0411* (2013.01)

(58) Field of Classification Search
  CPC ............ G06F 11/1072; G06F 11/1048; G06F 11/1044; G06F 11/1068; G11C 29/52; G11C 7/1006; G11C 29/78; G11C 11/5642; G11C 16/0483; G11C 16/10; G11C 11/5628; G11C 2211/5641; H03M 13/2906; H03M 13/05; H03M 13/03; H03M 13/35; H03M 13/1102
  See application file for complete search history.

(56) References Cited

U.S. PATENT DOCUMENTS

| | | | |
|---|---|---|---|
| 7,924,587 B2 | 4/2011 | Perlmutter et al. | |
| 8,418,026 B2 | 4/2013 | D'Abreu et al. | |
| 8,539,313 B2 | 9/2013 | D'Abreu et al. | |
| 8,880,977 B2 | 11/2014 | Sharon et al. | |
| 2009/0241009 A1* | 9/2009 | Kong | G06F 11/1072 714/763 |
| 2011/0258514 A1* | 10/2011 | Lasser | G06F 11/1012 714/763 |
| 2012/0063231 A1* | 3/2012 | Wood | G11C 16/10 365/185.18 |
| 2013/0024605 A1* | 1/2013 | Sharon | G06F 11/1072 711/103 |
| 2013/0166986 A1* | 6/2013 | Alrod | G06F 11/1048 714/755 |

(Continued)

*Primary Examiner* — Guerrier Merant
(74) *Attorney, Agent, or Firm* — Toler Law Group, PC

(57) ABSTRACT

A method includes generating a first error correcting code (ECC) codeword and a second ECC codeword. The method further includes generating redundancy information based on at least a portion of the first ECC codeword and further based on at least a portion of the second ECC codeword. The method further includes storing the first ECC codeword, the second ECC codeword, and the redundancy information at a word line of a memory of a data storage device.

20 Claims, 8 Drawing Sheets

(56) References Cited

U.S. PATENT DOCUMENTS

2014/0075259 A1   3/2014  Tam
2015/0229337 A1*  8/2015  Alhussien ............ H03M 13/35
                                              714/773

* cited by examiner

DATA STORAGE DEVICE AND METHOD FOR STORING MULTIPLE CODEWORDS AND REDUNDANCY INFORMATION AT A WORD LINE

FIELD OF THE DISCLOSURE

This disclosure is generally related to data storage devices and more particularly to error correction processes for data storage devices.

BACKGROUND

Non-volatile storage devices have enabled increased portability of data and software applications. Non-volatile storage devices can enhance data storage density by storing multiple bits in each memory cell. For example, some non-volatile storage devices provide increased storage density by storing information that indicates two bits per cell, three bits per cell, four bits per cell, or more. Further, as semiconductor processes scale down, integrated circuits may store more information for a particular circuit area.

In some cases, increasing the number of bits per cell and reducing device feature dimensions may increase an error rate of data stored at the memory device. As a result, semiconductor yield may be relatively low until the particular device design and/or the semiconductor process improve (or "mature").

While a particular device design and/or semiconductor processor are still maturing, some device manufacturers discard "marginal" semiconductor products that do not satisfy design criteria. For example, a memory die having a high error rate may be discarded during testing of the memory die after fabrication. Accordingly, a large number of memory dies may be fabricated to produce a smaller number of "acceptable" memory dies, which increases fabrication cost and overhead. Other device manufacturers may produce a "customized" controller for use with the memory dies while the design of the memory dies and/or the semiconductor process mature (e.g., a controller having a high error correction capability). Designing such a "customized" controller may be expensive.

DETAILED DESCRIPTION

A data storage device may be configured to utilize an "extended" multi-level cell (MLC) scheme to store additional redundancy information in addition to error correcting code (ECC) information of a codeword. For example, a middle page of a word line may store redundancy information associated with a first codeword of an upper page of the word line and may also store redundancy information associated with a second codeword of a lower page of the word line. "Extending" the upper page and the lower page into the middle page to store additional redundancy information may enable the data storage device to successfully decode the codewords even when an error rate is large.

Advantageously, the extended MLC scheme may be implemented in devices that incorporate "maturing" device technology to improve device performance without requiring substantial redesign after maturity is achieved. For example, instead of designing different controllers to be used for the maturing and mature phases, a single controller that supports the extended MLC scheme may be used, where the extended MLC scheme may be utilized for devices fabricated during the maturing phase and may be terminated for devices fabricated during the mature phase. For example, devices fabricated during the mature phase may use another scheme, such as a "traditional" tri-level-cell (TLC) scheme that writes three logical pages to a word line.

The extended MLC scheme may be applied to "marginal" memory dies (in order to increase semiconductor yield). To illustrate, if a data storage device includes multiple memory dies, the extended MLC scheme may be selectively applied to some memory dies but not other memory dies. Alternatively or in addition, the extended MLC scheme may be applied to particular storage regions of the data storage device. For example, the extended MLC scheme may be applied to "unhealthy" blocks of the data storage device, such as "marginal" blocks that are located at a periphery of a memory and/or blocks having a large number of program/erase cycles.

Particular aspects of the present disclosure are described below with reference to the drawings. In the description, common features are designated by common reference numbers. As used herein, "exemplary" may indicate an example, an implementation, and/or an aspect, and should not be construed as limiting or as indicating a preference or a preferred implementation.

Figure 1A:
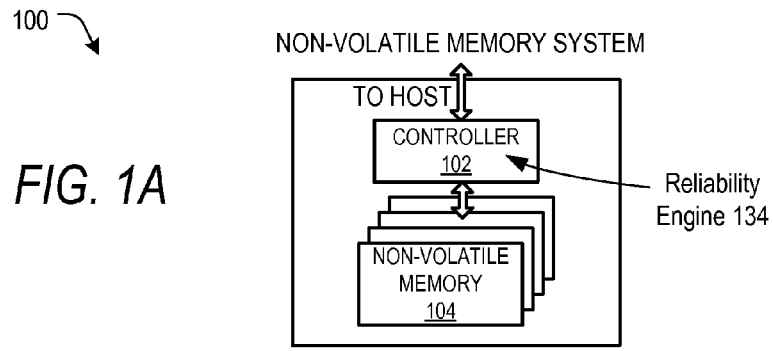
FIG. 1A is a block diagram of an illustrative example of a non-volatile memory system including a controller that includes a reliability engine that may be configured to operate according to an extended multi-level-cell (MLC) scheme.
Figure 1B:
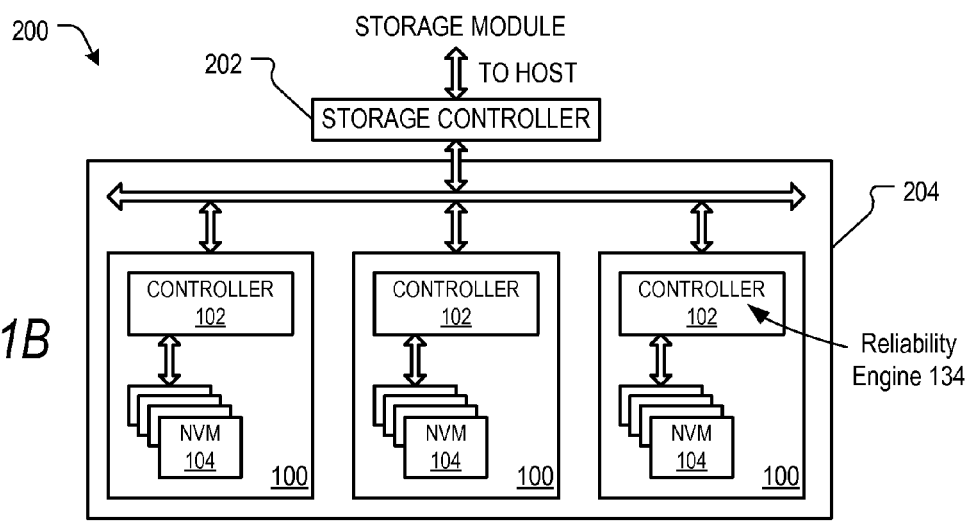
FIG. 1B is a block diagram of an illustrative example of a storage module that includes plural non-volatile memory systems that each may include a reliability engine that may be configured to operate according to an extended MLC scheme.
Figure 1C:
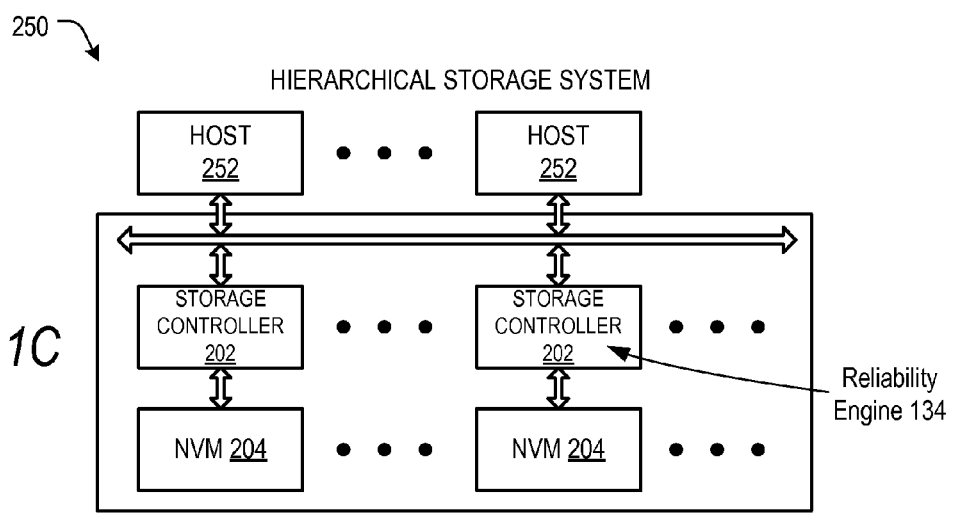
FIG. 1C is a block diagram of an illustrative example of a hierarchical storage system that includes a plurality of storage controllers that each may include a reliability engine that may be configured to operate according to an extended MLC scheme.

Memory systems suitable for use in implementing aspects of the disclosure are shown in FIGS. 1A-1C. FIG. 1A is a block diagram illustrating a non-volatile memory system according to an embodiment of the subject matter described herein. Referring to FIG. 1A, a non-volatile memory system 100 includes a controller 102 and non-volatile memory that may be made up of one or more non-volatile memory die 104. As used herein, the term "memory die" refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104. The controller 102 may include a reliability engine 134 that may be configured to operate according to an extended MLC scheme. An illustrative implementation of the reliability engine 134 is described further with reference to FIG. 3.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, a host communicates with the flash memory controller to read data from or write data to the flash memory. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, non-volatile memory system 100 may be a card based system, such as a secure digital (SD) or a micro secure digital (micro-SD) card. In an alternate embodiment, memory system 100 may be part of an embedded memory system.

Although, in the example illustrated in FIG. 1A, non-volatile memory system 100 (sometimes referred to herein as a storage module) includes a single channel between controller 102 and non-volatile memory die 104, the subject matter described herein is not limited to having a single memory channel. For example, in some NAND memory system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller 102 and the non-volatile memory die 104, even if a single channel is shown in the drawings.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers. Each controller 102 of FIG. 1B may include reliability engine corresponding to the reliability engine 134. Alternatively or in addition, the storage controller 202 may include a reliability engine corresponding to the reliability engine 134.

FIG. 1C is a block diagram illustrating a hierarchical storage system. A hierarchical storage system 250 includes a plurality of storage controllers 202, each of which controls a respective storage system 204. Host systems 252 may access memories within the hierarchical storage system 250 via a bus interface. In one embodiment, the bus interface may be an NVMe or fiber channel over Ethernet (FCoE) interface. In one embodiment, the hierarchical storage system 250 illustrated in FIG. 1C may be a rack mountable mass storage system that is accessible by multiple host computers, such as would be found in a data center or other location where mass storage is needed. Each storage controller 202 of FIG. 1C may include a reliability engine corresponding to the reliability engine 134.

Figure 2A:
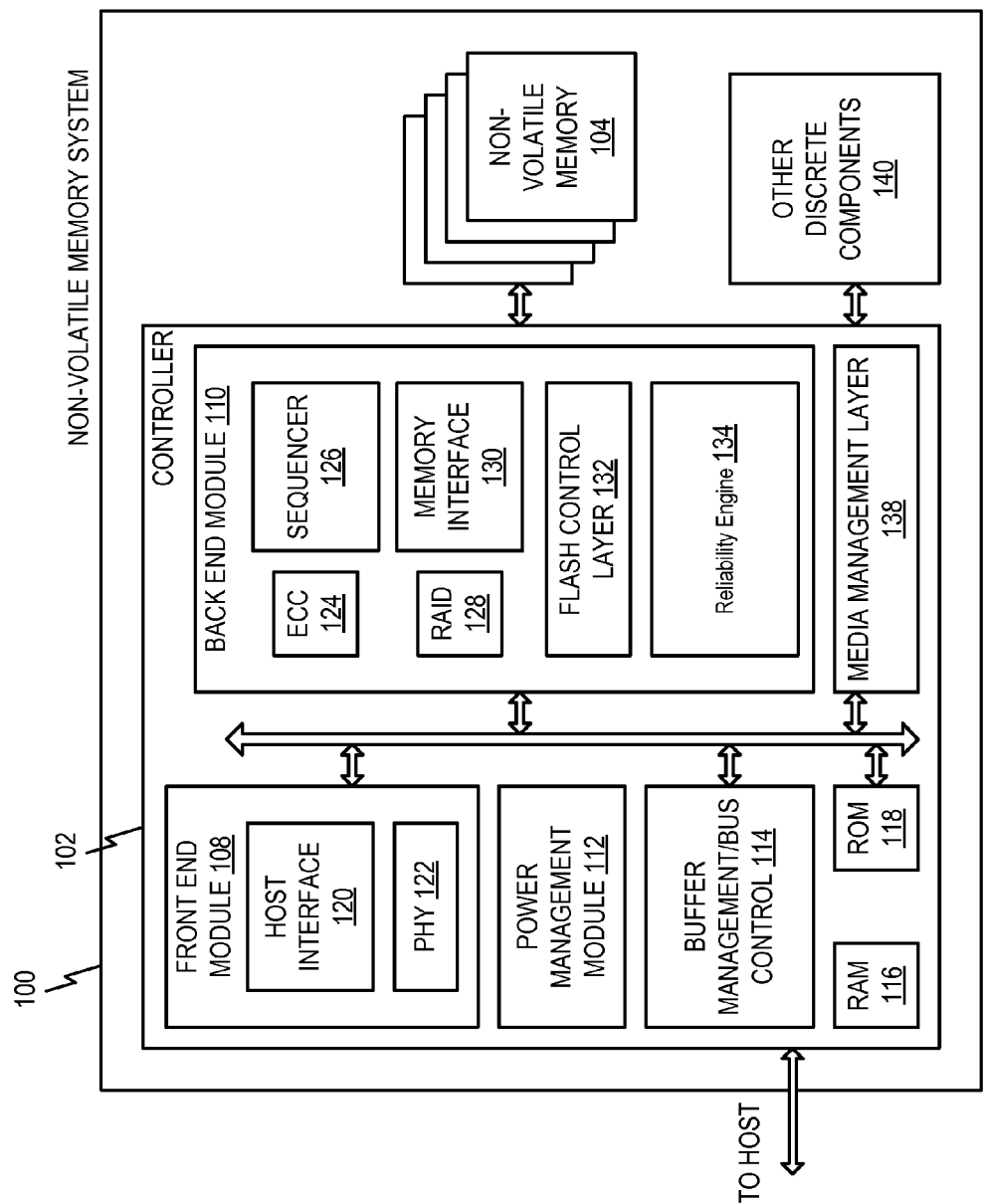
FIG. 2A is a block diagram illustrating an example of a non-volatile memory system including a controller that includes a reliability engine that may be configured to operate according to an extended MLC scheme.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 102, a buffer manager/bus controller 114 manages buffers in random access memory (RAM) 116 and controls the internal bus arbitration of the controller 102. A read only memory (ROM) 118 stores system boot code. Although illustrated in FIG. 2A as located within the controller 102, in other embodiments one or both of the RAM 116 and the ROM 118 may be located externally to the controller 102. In yet other embodiments, portions of RAM and ROM may be located both within the controller 102 and outside the controller 102.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the non-volatile memory die 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110. The back end module 110 may also include the reliability engine 134.

Additional components of system 100 illustrated in FIG. 2A include a power management module 112 and a media management layer 138, which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that may be omitted from the controller 102.

Figure 2B:
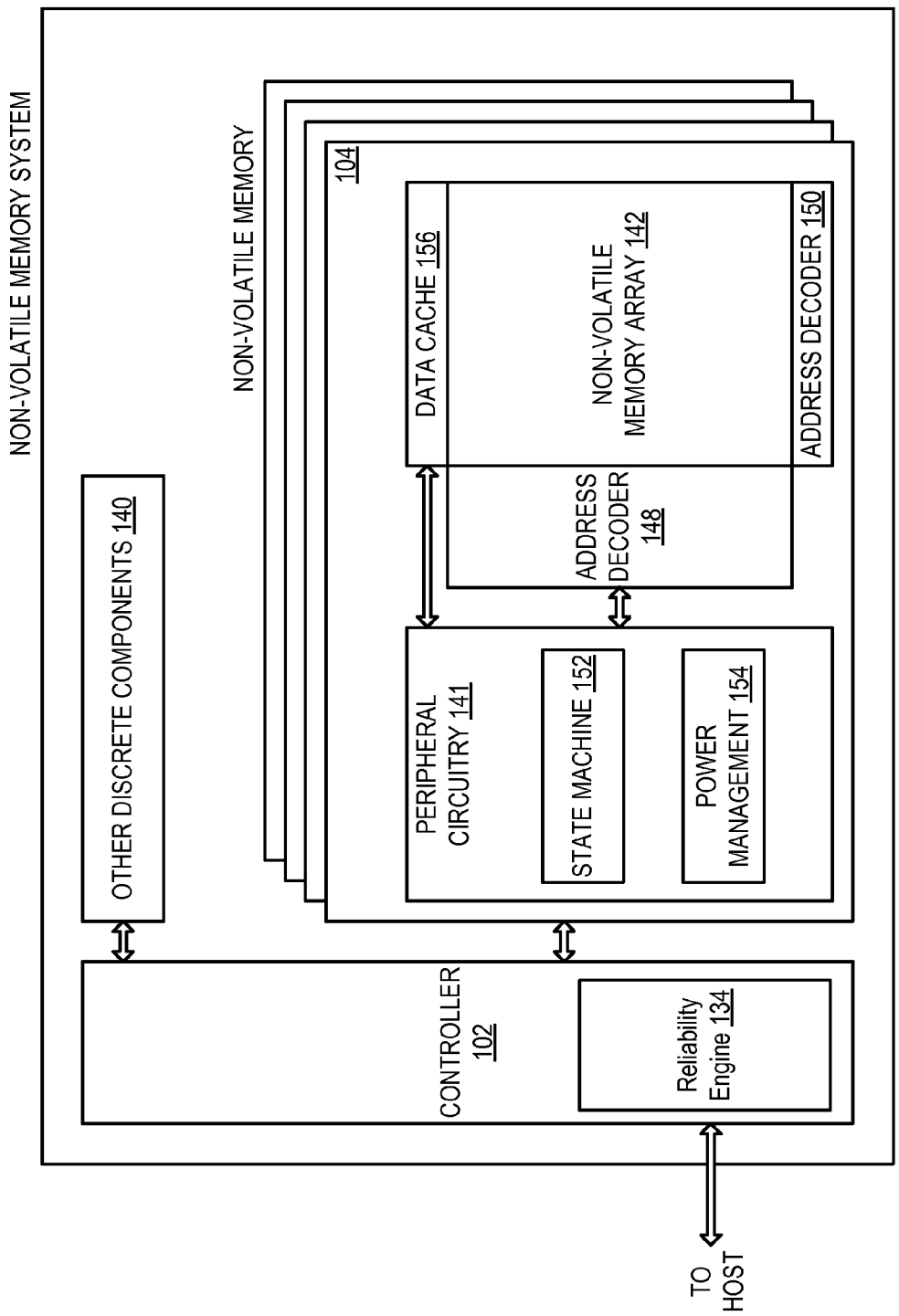
FIG. 2B is a block diagram illustrating exemplary components of a non-volatile memory die that may be coupled to a controller that includes a reliability engine that may be configured to operate according to an extended MLC scheme.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102, which may include the reliability engine 134. Peripheral circuitry 141 may also include a power management module 154. Non-volatile memory die 104 further includes discrete components 140, an address decoder 148, an address decoder 150, and a data cache 156 that caches data.

Figure 3:
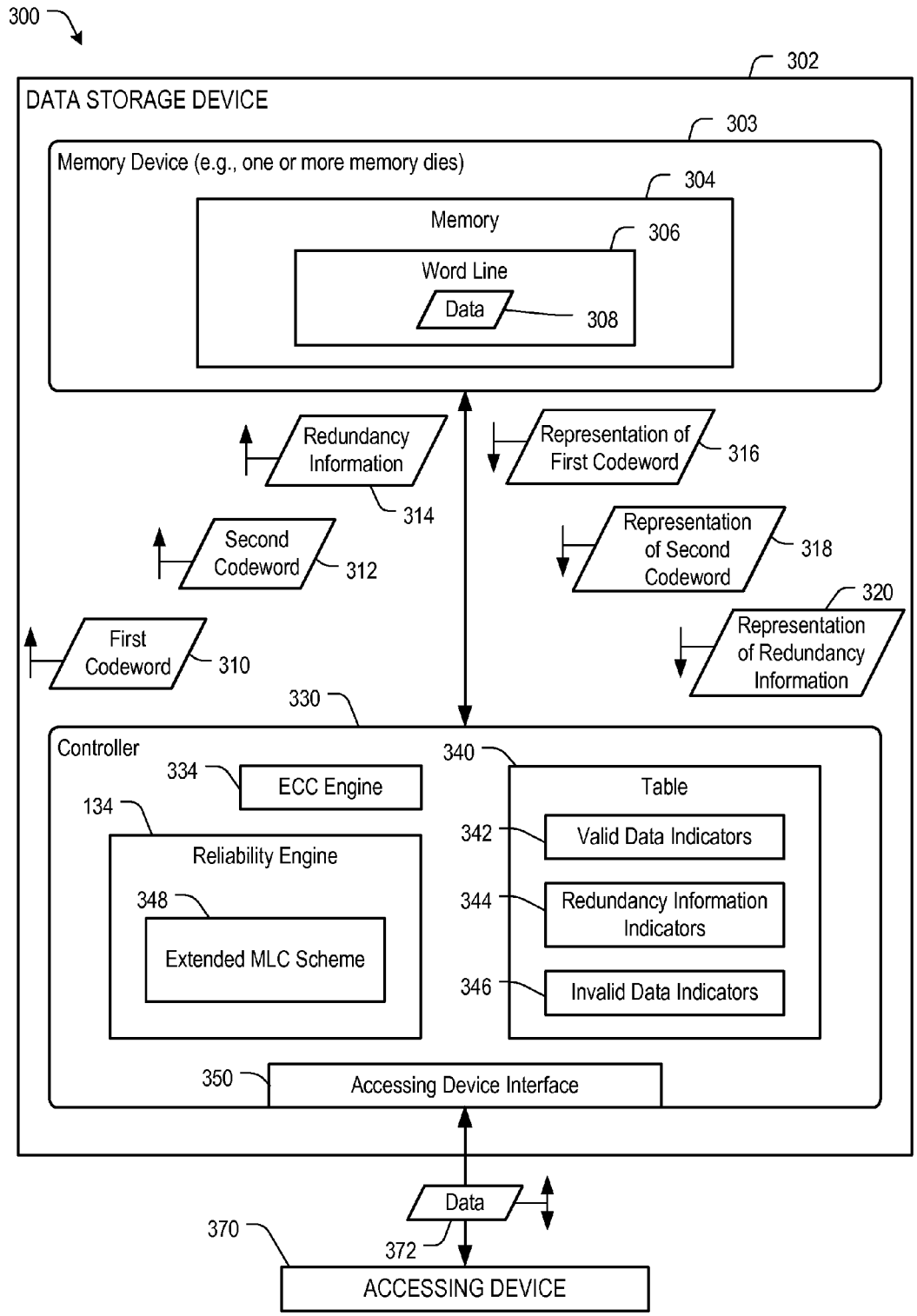
FIG. 3 is a block diagram of a particular illustrative embodiment of a system including a data storage device having a reliability engine that may be configured to operate according to an extended MLC scheme.

FIG. 3 depicts an illustrative example of a system 300. The system 300 includes a data storage device 302 (e.g., the non-volatile memory system 100) and an accessing device 370 (e.g., a host device, such as the host 252).

The data storage device 302 may include a memory device 303. The memory device 303 may include one or more memory dies (e.g., one memory die, two memory dies, eight memory dies, or another number of memory dies). To further illustrate, the memory device 303 may include the non-volatile memory die 104.

The memory device 303 includes a memory 304, such as a non-volatile memory of storage elements included in a memory die of the memory device 303. For example, the memory 304 may include a flash memory, such as a NAND flash memory, or a resistive memory, such as a resistive random access memory (ReRAM), as illustrative examples. The memory 304 may have a three-dimensional (3D) memory configuration. As an example, the memory 304 may have a 3D vertical bit line (VBL) configuration. In a particular implementation, the memory 304 is a non-volatile memory having a 3D memory configuration that is monolithically formed in one or more physical levels of arrays of memory cells having an active area disposed above a silicon substrate. Alternatively, the memory 304 may have another configuration, such as a two-dimensional (2D) memory configuration or a non-monolithic 3D memory configuration (e.g., a stacked die 3D memory configuration).

The memory 304 may include one or more regions of storage elements. An example of a storage region is a block, such as a NAND flash erase group of storage elements. Another example of a storage region is a word line of storage elements, such as a word line 306. A word line may function as a single-level-cell (SLC) word line, as a multi-level-cell (MLC) word line, or as a tri-level-cell (TLC) word line, as illustrative examples. Each storage element of the memory 304 may be programmable to a state (e.g., a threshold voltage in a flash configuration or a resistive state in a resistive memory configuration) that indicates one or more values. As an example, in an illustrative TLC scheme, each storage element of the word line 306 may be programmable to a state that indicates three values. As an additional example, in an illustrative MLC scheme, each storage element of the word line 306 may be programmable to a state that indicates two values.

The data storage device 302 may further include a controller 330. The controller 330 may include an ECC engine 334 and an accessing device interface 350 (e.g., a host interface). For example, the ECC engine 334 may correspond to the ECC engine 124, and the accessing device interface 350 may correspond to the host interface 120. The controller 330 may further include the reliability engine 134. The controller 330 may store a table 340.

The ECC engine 334 may include one or more encoders, such as a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof. The ECC engine 334 may include one or more decoders, such as a Hamming decoder, an RS decoder, a BCH decoder, an LDPC decoder, a decoder configured to decode data according to one or more other ECC schemes, or a combination thereof.

During operation, the controller 330 is configured to receive data and instructions from the accessing device 370 using the accessing device interface 350. For example, the controller 330 may receive data 372 from the accessing device 370 via the accessing device interface 350. For example, the data 372 may include one or more files (e.g., an image file, an audio file, and/or a video file, as illustrative examples) to be stored at the data storage device 302.

The ECC engine 334 may be configured to receive the data 372. The ECC engine 334 may be configured to initiate an encoding process using the data 372, such as by inputting the data 372 to an encoder of the ECC engine 334 to generate one or more ECC codewords based on the data 372. For example, the ECC engine 334 may generate first encoded data (e.g., a first codeword 310) and second encoded data (e.g., a second codeword 312) based on the data 372.

The reliability engine 134 may be configured to generate third data, such as redundancy information 314 (e.g., ECC information and/or parity information) based on the codewords 310, 312 (or based on the data 372). For example, the reliability engine 134 may be configured to generate the redundancy information 314 in accordance with an "extended" MLC scheme 348. In an illustrative implementation, operation according to the extended MLC scheme 348 results in one or more pages of a three-page scheme that store redundancy information (e.g., the redundancy information 314) instead of storing user data (e.g., instead of storing a codeword representing user data, such as the codewords 310, 312). In this example, a TLC scheme is "converted" to the extended MLC scheme 348 (e.g., so that the word line 306 may store two codewords that "extend" from a lower page and from an upper page into a middle page instead of storing three codewords).

Depending on the particular application, the extended MLC scheme 348 may specify one or more operations to generate the redundancy information 314. In an illustrative example, the extended MLC scheme 348 specifies that the redundancy information 314 is to include additional (or "extra") ECC information or parity information associated with the codewords 310, 312 to enable the ECC engine 334 to decode the codewords 310, 312 (or a portion thereof) if an error rate of the codewords 310, 312 exceeds an error correction capability associated with the particular ECC scheme. An illustrative example of the extended MLC scheme 348 is described further with reference to FIG. 4.

The controller 330 is configured to send data and commands to the memory device 303. For example, the controller 330 is configured to send data 308 that includes the codewords 310, 312 and the redundancy information 314, and to send one or more write commands to cause the memory device 303 to store the data 308 to a specified address of the memory 304. The one or more write commands may specify a physical address of a portion of the memory 304 that is to store the data 308, such as a physical address of the word line 306. Depending on the particular implementation, the codewords 310, 312 and the redundancy information 314 may be sent from the controller 330 to the memory device 303 sequentially or in parallel. In addition, depending on the particular application, the codewords 310, 312 and the redundancy information 314 may be stored in an SLC cache of the memory device 303 and then copied from the SLC cache to the word line 306, or the codewords 310, 312 and the redundancy information 314 may be provided to the word line 306 without use of an SLC cache.

The memory device 303 may be configured to store the codewords 310, 312 and the redundancy information 314 at the word line 306. To illustrate, in an illustrative three-bit-per-cell configuration, the memory device 303 may include multiple data latches, such as a first latch, a second latch, and a third latch. The first latch may receive the first codeword 310, the second latch may receive the second codeword 312, and the third latch may receive the redundancy information 314. In this example, the memory device 303 may access the codewords 310, 312 and the redundancy information 314 from the multiple data latches and may generate the data 308 based on the codewords 310, 312 and the redundancy information 314 using a three-bit-per-cell technique (e.g., by selecting threshold voltages to be programmed to storage elements of the word line 306 to represents bits of the codewords 310, 312 and the redundancy information 314). In an illustrative example, the first codeword 310 is represented by an upper page indicated by the data 308, the second codeword 312 is represented by a lower page indicated by the data 308, and the redundancy information is represented by a middle page indicated by the data 308. The memory device 303 may write the data 308 to the word line 306 (e.g., using read/write circuitry of the memory device 303).

The reliability engine 134 may update the table 340 in response to storing the codewords 310, 312 and the redundancy information 314 to the memory 304. For example, the reliability engine 134 may update valid data indicators 342, such as by indicating that an upper page associated with the word line 306 stores valid data (e.g., the first codeword 310) and that a lower page associated with the word line 306 stores valid data (e.g., the second codeword 312). As another example, the reliability engine 134 may update redundancy information indicators 344 to indicate that a middle page associated with the word line 306 stores redundancy information (e.g., the redundancy information 314). In certain implementations, the middle page may store invalid data, such as a sequence of bits (e.g., a sequence of logic one bits to "fill in" the middle page if ECC and parity information does not occupy the entire middle page). In this example, the reliability engine 134 may update invalid data indicators 346 to indicate that the middle page (or a particular portion of the middle page) stores invalid data. An illustrative example of a middle page that stores invalid data is described further with reference to FIG. 4.

The controller 330 is configured to access data stored at the memory device 303. For example, the controller 330 may receive a request for read access to one or both of the codewords 310, 312 from the accessing device 370 to access data from a specified address of the memory 304. The read command may specify a physical address of the word line 306. In response to the request, the controller 330 may send a read command to the memory device 303. The memory device 303 may sense the word line 306 to generate a representation 316 of the first codeword 310 and/or to generate a representation 318 of the second codeword 312. The memory device 303 may send the representations 316, 318 to the controller 330. The representations 316, 318 may match the codewords 310, 312, or the representations 316, 318 may differ from the codewords 310, 312 due to one or more bit errors.

The controller 330 may input the representations 316, 318 to the ECC engine 334. If the ECC engine 334 decodes the representations 316, 318 successfully, the ECC engine 334 may output decoded data (e.g., the data 372), and the controller 330 may provide the decoded data to the accessing device 370 (e.g., by providing the data 372 to the accessing device 370 via the accessing device interface 350).

If the ECC engine 334 does not successfully decode the representations 316, 318, the controller 330 may utilize a representation 320 of the redundancy information 314 to "assist" in decoding one or more of the representations 316, 318. In some implementations, the representation 320 is generated automatically in response to accessing the word line 306. As an example, if the word line 306 has a three-bit-per-cell configuration, then in some implementations the memory device 303 may provide a representation of each page of the word line 306 (an upper page, a lower page, and a middle page) to the controller 330 in response to accessing the word line 306. In this example, the memory device 303 may provide each of the representations 316, 318, and 320 to the controller 330.

In other implementations, the controller 330 may be configured to selectively access additional redundancy information (e.g., on an "as needed" basis). To illustrate, in response to an error rate associated with one or both of the representations 316, 318 satisfying a threshold (e.g., a particular bit error rate (BER)), the controller 330 may send a command to the memory device 303 to sense the word line 306 to generate the representation 320. As an illustrative example, if an uncorrectable error correcting code (UECC) event occurs during decoding of one or both of the representations 316, 318, then the controller 330 may send the command to the memory device 303 to cause the memory device 303 to generate the representation 320. In other cases, such as when an error rate is estimated prior to decoding, the threshold may be less than the error correcting capability of the particular ECC scheme (in order to avoid one or more ECC errors that may occur if the error rate is determined to be above the threshold).

In some implementations, the reliability engine 134 is configured to access the table 340 to determine whether additional redundancy information is associated with one or both of the codewords 310, 312. As an illustrative example, the reliability engine 134 may access the redundancy information indicators 344 to determine whether a middle page associated with the word line 306 stores additional redundancy information. If the table 340 indicates that additional redundancy information is associated with the codewords 310, 312, the controller 330 may send a read command to the memory device 303. To illustrate, if a middle page associated with the word line 306 stores the redundancy information 314, the controller 330 may send a read command to the memory device 303 indicating that a middle page of the word line 306 is to be sensed. In this example, the memory device 303 may provide the representation 320 of the redundancy information 314 to the controller 330 in response to the read command.

The controller 330 may be configured to error correct one or more of the representations 316, 318 using the representation 320. If the ECC engine 334 successfully decodes the representations 316, 318 using the representation 320, the controller 330 may provide decoded data (e.g., the data 372) to the accessing device 370. In some cases, if the decoding process fails due to an error rate that exceeds an error correction capability of the particular ECC scheme, the controller 330 may provide an indication to the accessing device 370 that the data 372 is unavailable.

One or more operations described with reference to FIG. 3 can be performed on either a "per-device" basis, a "per-die" basis, or a "per-region" basis. To illustrate, operations described with reference to FIG. 3 may be performed on a per-device basis by performing the operations with respect to each word line of the memory device 303. In this case, each word line of the memory device 303 may be operated in accordance with the extended MLC scheme 348. If operations are performed on a per-die basis, then the operations may be applied with respect to a first set of one or more memory dies of the memory device 303 (without performing the operations with respect to a second set of one or more memory dies of the memory device 303).

Alternatively or in addition to a per-die basis, the operations may be applied on a per-region basis by performing the operations with respect to some storage regions of a memory die of the memory device 303 (but not all storage regions of the memory die). For example, a storage region may correspond to a block of the memory 304 or a set of one or more word lines of the memory 304. One or more "marginal" blocks or word lines of the memory 304 may be detected during testing of the memory device 303 and may be tagged (e.g., using the table 340) for operation according to the extended MLC scheme 348. One or more other blocks or word lines of the memory 304 may be operated based on a "normal" TLC mode of operation. An illustrative example of a "marginal" block may include a block located at a periphery of a memory die of the memory device 303 (e.g., an "edge" block).

Depending on the particular application, use of the extended MLC scheme 348 (e.g., on a per-device basis, on a per-die basis, or on a per-region basis) may be determined during fabrication testing of a semiconductor device (e.g., the memory device 303). Alternatively or in addition, use of the extended MLC scheme 348 may be determined and/or updated during operation of the data storage device 302 (e.g., during operation by a user of the data storage device 302). As an illustrative example, the reliability engine 134 may be configured to monitor health of blocks of the memory device 303 during operation of the data storage device 302. If health of a block of the memory device 303 fails to satisfy a threshold (e.g., due to a number of program/erase cycles of the block satisfying a threshold), the reliability engine 134 may "downgrade" the block from TLC operation to operation according to the extended MLC scheme 348. In an illustrative implementation, the reliability engine 134 is configured to update the table 340 to indicate which blocks of the memory device 303 are associated with TLC operation and which blocks of the memory device 303 are associated with the extended MLC scheme 348.

The examples of FIG. 3 illustrate that the logical page (e.g., a middle page) can be "converted" to store redundancy information (e.g., the redundancy information 314) to increase error correction at a data storage device. In an illustrative implementation, the examples described with reference to FIG. 3 may enable a "marginal" device (or a "marginal" storage region of a device) to be utilized instead of discarding the device or changing a design associated with the device, which may reduce fabrication costs and overhead.

Figure 4:
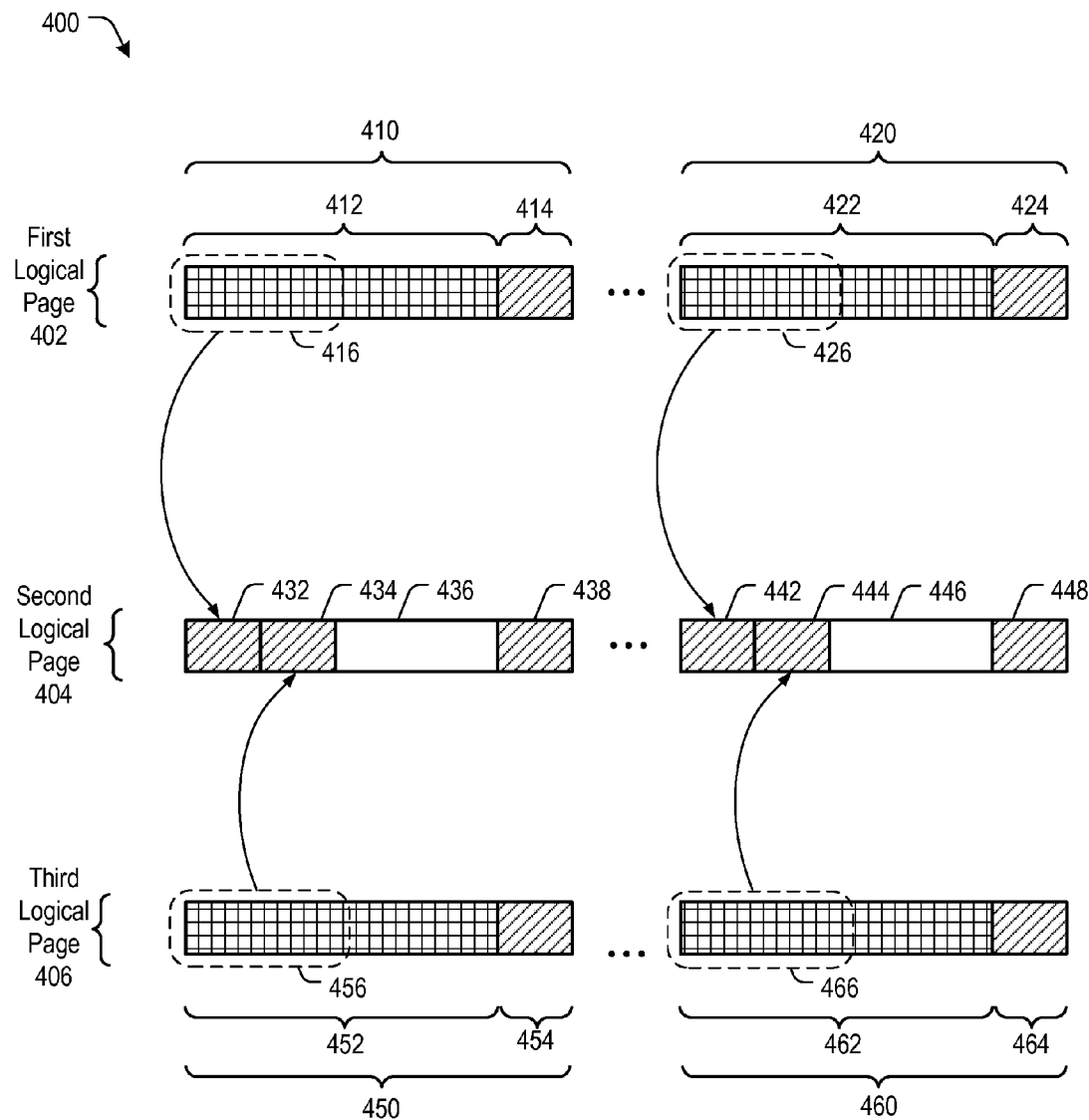
FIG. 4 is a diagram illustrating certain aspects of an example of an extended MLC scheme.

Referring to FIG. 4, an illustrative example of an extended MLC scheme is depicted and generally designated 400. For example, the extended MLC scheme may correspond to the extended MLC scheme 348 of FIG. 3.

The extended MLC scheme 400 may utilize multiple logical pages. For example, the extended MLC scheme 400 may utilize a first logical page 402 (e.g., an upper page), a second logical page 404 (e.g., a middle page), and a third logical page 406 (e.g., a lower page). The pages 402, 404, and 406 may correspond to logical groupings of data stored in a single physical page of a memory that implements three-bit-per-cell storage. In this case, the MLC scheme 400 may correspond to a three-bits-per-cell implementation. In other cases, a different number of bits per cell may be utilized (e.g., four, or another number of bits per cell).

Data of the pages 402, 404, and 406 may be included in the data 308 of FIG. 3. To illustrate, each storage element of the word line 306 may be programmed to a state (e.g., a threshold voltage or a resistive state) that indicates a corresponding value of the first logical page 402, a corresponding value of the second logical page 404, and a corresponding value of the third logical page 406.

The first logical page 402 may include one or more codewords. For example, the first logical page 402 may include a codeword 410 and a codeword 420. Either of the codewords 410, 420 may correspond to another codeword described herein, such as the first codeword 310 of FIG. 3. The codeword 410 may include user data 412 (e.g., a systematic portion of the codeword 410) and a parity portion 414 (e.g., parity bits) generated based on the user data 412. The codeword 420 may include user data 422 (e.g., a systematic portion of the codeword 420) and a parity portion 424 (e.g., parity bits) generated based on the user data 422.

The third logical page 406 may include one or more codewords. For example, the third logical page 406 may include a codeword 450 and a codeword 460. Either of the codewords 450, 460 may correspond to another codeword described herein, such as the second codeword 312 of FIG. 3. The codeword 450 may include user data 452 (e.g., a systematic portion of the codeword 450) and a parity portion 454 (e.g., parity bits) generated based on the user data 452. The codeword 460 may include user data 462 (e.g., a systematic portion of the codeword 460) and a parity portion 464 (e.g., parity bits) generated based on the user data 462.

The second logical page 404 may include redundancy information generated based on one or both of the codewords 410, 450 (or a portion thereof). For example, the second logical page 404 may include ECC information 432 that is generated based on a portion 416 of the codeword 410. As another example, the second logical page 404 may further include ECC information 434 that is generated based on a portion 456 of the codeword 450. To illustrate, the portion 416 may be separately encoded by the ECC engine 334 to generate a full set of parity bits for a reduced amount of user data, resulting in an increased correction capacity for the portion 416 as compared to the user data 412.

The second logical page 404 may also include invalid data 436. In some implementations, the invalid data 436 includes "dummy" data (e.g., a bit pattern, such as pattern of logic one bits). In some cases, storing the invalid data 436 in the second logical page 404 may reduce a probability that the second logical page 404 may be corrupted due to a large number of errors (e.g., due to program disturb errors and/or read disturb errors). For example, in some implementations, states representing a first logic bit (e.g., a logic one bit) are less susceptible to errors as compared to states representing a second logic bit (e.g., a logic zero bit). In this case, the invalid data 436 may include a sequence of the first logic bit, which may reduce a number of storage elements programmed to the second logic bit (and which may reduce a number of errors associated with the second logical page 404).

The second logical page 404 may also include parity protection information 438. In the example of FIG. 4, the parity protection information 438 may be generated based on one or both of the ECC information 432, 434. For example, one or both of the ECC information 432, 434 may be encoded to generate the parity protection information 438, which may enable the ECC engine 334 to error correct one or both of the ECC information 432, 434 in the event that one or both of the ECC information 432, 434 include one or more errors. In an illustrative implementation, the ECC information 432, 434 and the invalid data 436 are input to the ECC engine 334 to generate the parity protection information 438 (e.g., the ECC information 432, 434, the invalid data 436, and the parity protection information 438 may form a codeword).

The second logical page 404 may further include ECC information 442, ECC information 444, invalid data 446, and parity protection information 448. For example, the ECC information 442 may be generated based on a portion 426 of the codeword 420. As another example, the ECC information 444 may be generated based on a portion 466 of the codeword 460. The invalid data 436 may include invalid data, such as "dummy" data (e.g., a bit pattern, such as pattern of logic one bits). In an illustrative implementation, the parity protection information 448 is generated by encoding one or both of the ECC information 442, 444. In an illustrative implementation, the ECC information 442, 444 and the invalid data 446 are input to the ECC engine 334 to generate the parity protection information 448 (e.g., the ECC information 442, 444, the invalid data 446, and the parity protection information 448 may form a codeword).

In an illustrative example, the codeword 410 corresponds to the first codeword 310, the codeword 450 corresponds to the second codeword 312, and the ECC information 432, 434 and the parity protection information 438 are included in the redundancy information 314 of FIG. 3. In another illustrative example, the codeword 420 corresponds to the first codeword 310, the codeword 460 corresponds to the second codeword 312, and the ECC information 442, 444 and the parity protection information 448 are included in the redundancy information 314 of FIG. 3.

The portions 416, 426, 456, and 466 may correspond to sub-sectors of the codewords 410, 420, 450, and 460, respectively. To illustrate, in some implementations, the user data 412, 422, 452, and 462 may each have a length of approximately 2 kilobytes (kB), and the portions 416, 426, 456, and 466 may each have a length of approximately 1 kB. In this case, the length of a sub-sector may be half the length of a sector. In other cases, a subsector may have a different length (e.g., one-fourth the length of a sector, so that a sub-sector has a length of 512 bytes).

Alternatively or in addition, redundancy information may be generated in some cases for multiple subsectors of a single codeword, and the second logical page 404 may store the redundancy information for the multiple subsectors. To illustrate, for a more unhealthy storage region, more sub-sectors may be used for each codeword (e.g., by generating two sets of ECC information for two sub-sectors of a codeword instead of one sub-sector, as an illustrative example).

Depending on the particular implementation, the ECC information 432, 434, 442, and 444 may be generated using a common ECC scheme used to generate the parity portions 414, 424, 454, and 464. In other cases, the ECC information 432, 434, 442, and 444 may be generated using a different ECC scheme, such as by using a code rate that is less than a code rate used to generate the parity portions 414, 424, 454, and 464. To illustrate, in a particular example, a length of the parity portion 414 is the same as a length of the ECC information 432 (e.g., 230 bytes, or another length), and a length of the portion 416 is half a length of the user data 412 (e.g., 1 kB and 2 kB, respectively). In this example, the code rate of the ECC information 432 may be half the code rate of the parity portion 414. Alternatively or in addition, the ECC information 432, 434, 442, and 444 may be generated using a "stronger" ECC technique with higher error correction capability.

During operation of the data storage device 302 of FIG. 3, the second logical page 404 may enable error correction in the event of a UECC error associated with one or more of the codewords 410, 420, 450, and 460. To illustrate, if the ECC engine 334 is unable to decode a representation of the codeword 410 due to a large number of errors, the controller 330 may send a command to the memory device 303 to sense a representation of the ECC information 432. The ECC engine 334 may utilize the representation of the ECC information 432 to error correct the portion 416 of the representation of the codeword 410 (to reduce a bit error rate of the representation of the codeword 410). After error correcting the portion 416 of the representation of the codeword 410, the ECC engine 334 may be able to decode through one or more remaining errors of the codeword 410 (due to the reduced bit error rate).

Alternatively or in addition, the parity protection information 438 and the parity protection information 448 may be used to error correct the ECC information 432, 434, 442, and 444. For example, if the ECC information 432 includes one or more errors, the ECC engine 334 may use the parity protection information 438 to error correct the ECC information 432 to generate error corrected ECC information. As an example, the ECC information 432, 434, the invalid data 436, and the parity protection information 438 may form a codeword that can be decoded by the ECC engine 334. Prior to the decoding, the ECC engine 334 may be configured to "manually" correct one or more values of the invalid data 436. For example, if the invalid data 436 is to include a sequence of logic one bits and one or more of the logic one bits have been corrupted to produce one or more logic zero bits, the ECC engine 334 may be configured to adjust the one or more corrupted bits prior to initiating decoding. After error correcting the ECC information 432, the ECC engine 334 may be able to decode through one or more remaining errors of the codeword 410 (using the error corrected ECC information). Accordingly, information stored at the second logical page 404 may have a high reliability, which may increase reliability of information stored at the logical pages 402, 404 (by effectively increasing error correction capability).

The example of FIG. 4 illustrates that the second logical page 404 may be used to store redundancy information, such as any of the ECC information 432, 434, 442, and 444 and/or any of the parity protection information 438, 448. The redundancy information may be utilized by the controller 330 to recover user data, such as to recover any of the user data 412, 422, 452, and 462 if an UECC event occurs. Thus, the first logical page 402 and/or the third logical page 406 may be "extended" into the second logical page 404 to convert a TLC scheme into the "extended" MLC scheme 400.

Further, because in some designs middle pages may be subject to more errors as compared to upper pages and lower pages, the pages 402, 406 may correspond to an upper page and a lower page that are selected to store user data, and the second logical page 404 may correspond to a middle page that is selected to store redundancy information and invalid data. To further illustrate, in a 2-3-2 mapping scheme of bits to states, a middle page may be associated with three bit transitions between states (e.g., between an "A" state and a "B" state, between a "C" state and a "D" state, and between and "E" state and an "F" state), and the upper page and the lower page may each be associated with two bit transitions between states. In other cases, upper pages or lower pages may be associated with more bit transitions between states (and higher error rates). For example, in a 2-2-3 mapping scheme, a lower page may be associated with three bit transitions between states (and lower reliability than an upper page and a middle page). In this case, the second logical page 404 may correspond to a lower page. As another example, in a 3-2-2 mapping scheme, an upper page may be associated with three bit transitions between states (and lower reliability than a middle page and a lower page). In this case, the second logical page 404 may correspond to an upper page.

Figure 5:
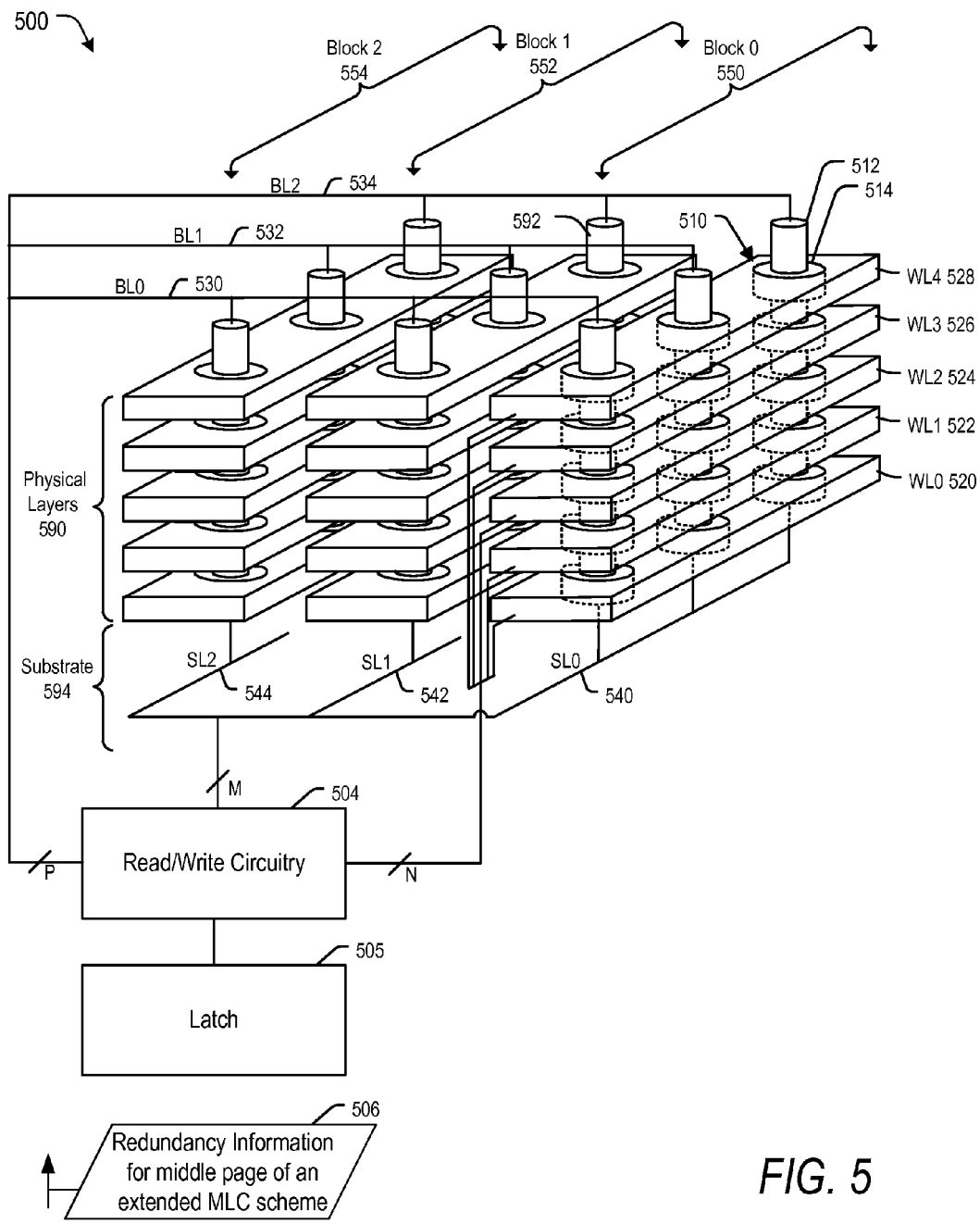
FIG. 5 is a diagram of an illustrative embodiment of a portion of a memory die.
Figure 6:
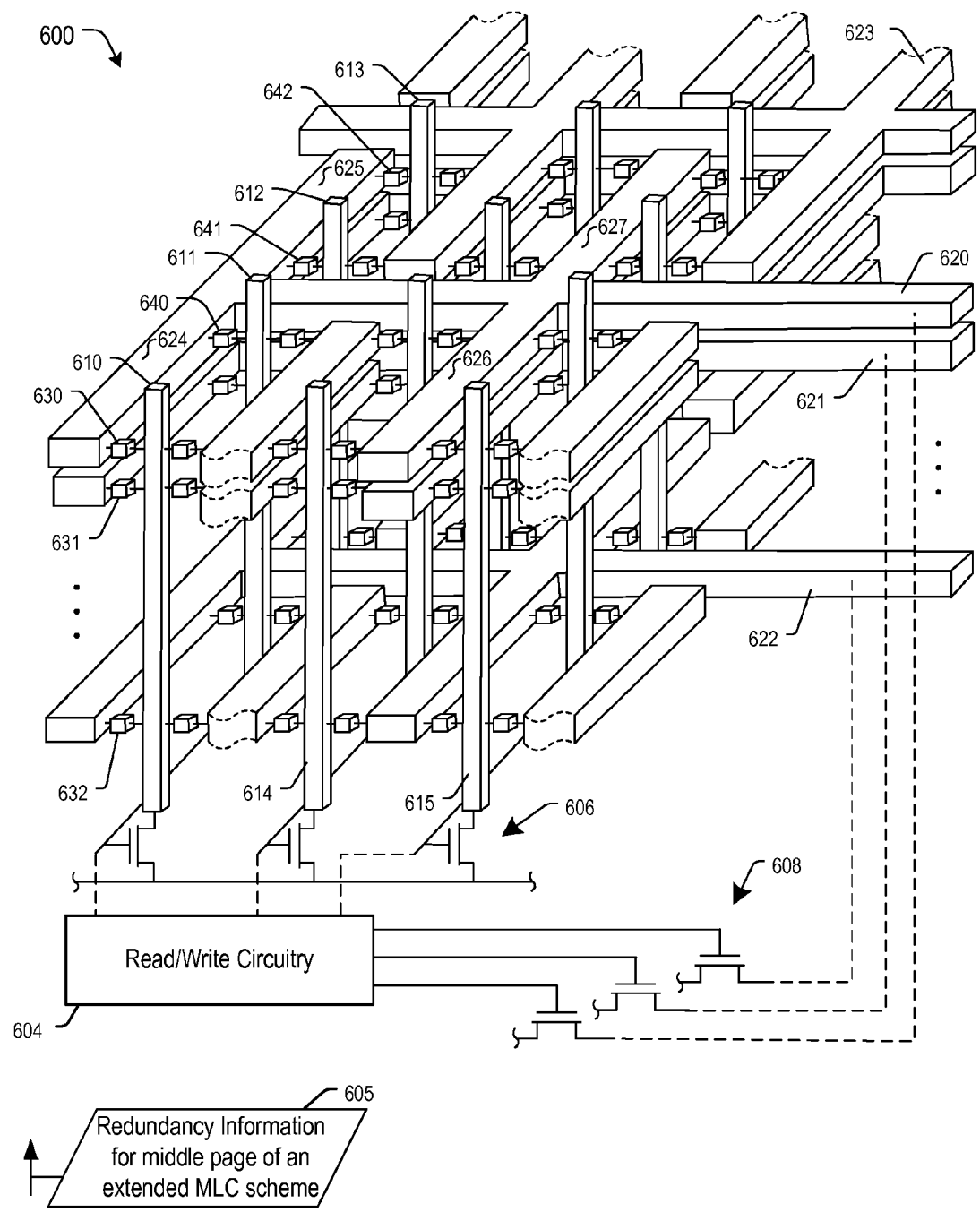
FIG. 6 is a diagram of another illustrative embodiment of a portion of a memory die.

FIGS. 5 and 6 illustrate certain examples of monolithic 3D memory configurations. It should be appreciated that FIGS. 5 and 6 are provided for illustration and that other implementations may utilize one or more other configurations, such as a planar memory configuration or a stacked die memory configuration, as illustrative examples.

FIG. 5 illustrates a portion of a memory die 500 having a NAND flash configuration. The memory die 500 may be included in the data storage device 302 of FIG. 3. For example, the memory die 500 may correspond to the memory device 303 of FIG. 3. The memory die 500 may be coupled to the controller 330 of FIG. 3.

The memory die 500 may include read/write circuitry 504 and one or more latches (e.g., a latch 505). The memory die 500 includes multiple physical layers, such as a group of physical layers 590. The multiple physical layers are monolithically formed above a substrate 594, such as a silicon substrate. Storage elements (e.g., memory cells), such as a representative memory cell 510, are arranged in arrays in the physical layers.

The representative memory cell 510 includes a charge trap structure 514 between a word line/control gate (WL4) 528 and a conductive channel 512. Charge may be injected into or drained from the charge trap structure 514 via biasing of the conductive channel 512 relative to the word line 528. For example, the charge trap structure 514 may include silicon nitride and may be separated from the word line 528 and the conductive channel 512 by a gate dielectric, such as silicon oxide. An amount of charge in the charge trap structure 514 affects an amount of current through the conductive channel 512 during a read operation of the memory cell 510 and indicates one or more bit values that are stored in the memory cell 510.

The memory die 500 includes multiple erase blocks, including a first block (block 0) 550, a second block (block 1) 552, and a third block (block 2) 554. Each block 550-554 includes a "vertical slice" of the physical layers 590 that includes a stack of word lines, illustrated as a first word line (WL0) 520, a second word line (WL1) 522, a third word line (WL2) 524, a fourth word line (WL3) 526, and a fifth word line (WL4) 528. Multiple conductive channels (having a substantially vertical orientation with respect to FIG. 5) extend through the stack of word lines. Each conductive channel is coupled to a storage element in each word line 520-528, forming a NAND string of storage elements. FIG. 5 illustrates three blocks 550-554, five word lines 520-528 in each block, and three conductive channels in each block for clarity of illustration. However, the memory die 500 may have more than three blocks, more than five word lines per block, and more than three conductive channels per block.

The read/write circuitry 504 is coupled to the conductive channels via multiple conductive lines, illustrated as a first bit line (BL0) 530, a second bit line (BL1) 532, and a third bit line (BL2) 534 at a "top" end of the conducive channels (e.g., farther from the substrate 594). The read/write circuitry 504 is also coupled to the conductive channels via multiple source lines, such as via a first source line (SL0) 540, a second source line (SL1) 542, and a third source line (SL2) 544 at a "bottom" end of the conductive channels (e.g., nearer to or within the substrate 594). The read/write circuitry 504 is illustrated as coupled to the bit lines 530-534 via "P" control lines, coupled to the source lines 540-544 via "M" control lines, and coupled to the word lines 520-528 via "N" control lines. Each of P, M, and N may have a positive integer value based on the specific configuration of the memory die 500. In the illustrative example of FIG. 5, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 592 and a particular source line may be coupled to the top of the conductive channel 512. The bottom of the conductive channel 592 may be coupled (e.g., electrically coupled) to the bottom of the conductive channel 512. Accordingly, the conductive channel 592 and the conductive channel 512 may be coupled in series and may be coupled to the particular bit line and the particular source line.

In operation, the memory die 500 may perform write operations and read operations, such as in response to receiving commands from the controller 330. For a write operation, the controller 330 may receive a request for write access from the accessing device 370. The request may include redundancy information 506 to be written at storage elements of the memory die 500. The redundancy information 506 may be stored using a page (e.g., a middle page) associated with an "extended" MLC scheme, such as the extended MLC scheme 348 and/or the extended MLC scheme 400. For example, the redundancy information 506 may include the redundancy information 314, any of the ECC information 432, 434, 442, and 444, and/or any of the parity protection information 438, 448.

The controller 330 may send a command with the redundancy information 506 to the memory die 500 to cause the memory die 500 to initiate the write operation. For example, the controller 330 may send a write opcode and a physical address to the read/write circuitry 504 and may send the redundancy information 506 to the latch 505. The controller 330 may also send other data (e.g., the codewords 310, 312) to be stored with the redundancy information 506 at a word line of the memory die 500 (e.g., at any of the word lines 520, 522, 525, 526, and 528).

The read/write circuitry 504 may be configured to access the redundancy information 506 in the latch 505 and to program the redundancy information 506 to storage elements of the memory die 500 based on one or more write parameters indicated by the particular command. For example, the read/write circuitry 504 may be configured to apply selection signals to control lines coupled to the word lines 520-528, the bit lines 530-534, and the source lines 540-542 to cause a programming voltage (e.g., a voltage pulse or series of voltage pulses) to be applied across one or more selected storage elements of the selected word line (e.g., the word line 528, as an illustrative example).

The read/write circuitry 504 may be configured to access the redundancy information 506 at the memory die 500 to generate a representation of the redundancy information 506 (e.g., the representation 320 of the redundancy information 314). For example, the controller 330 may receive a request for read access from the accessing device 370. The controller 330 may send a read command to the memory die 500 to generate a representation of the redundancy information 506. The memory die 500 may use the read/write circuitry 504 to sense storage elements of the memory die 500 and may provide the representation of the redundancy information 506 to the controller 330 (e.g., via the latch 505).

FIG. 6 illustrates a portion of a memory die 600 having a ReRAM configuration. The memory die 600 may be included in the data storage device 302 of FIG. 3. For example, the memory die 600 may correspond to the memory device 303 of FIG. 3. The memory die 600 may be coupled to the controller 330 of FIG. 3.

The memory die 600 may include read/write circuitry 604. In the example of FIG. 6, the memory die 600 includes a vertical bit line (VBL) ReRAM with a plurality of conductive lines in physical layers over a substrate (e.g., substantially parallel to a surface of the substrate), such as representative word lines 620, 621, 622, and 623 (only a portion of which is shown in FIG. 6). The VBL ReRAM also includes a plurality of vertical conductive lines through the physical layers, such as representative bit lines 610, 611, 612, and 613. The word line 622 may include or correspond to a first group of physical layers, and the word lines 620, 621 may include or correspond to a second group of physical layers.

The memory die 600 also includes a plurality of resistance-based storage elements (e.g., memory cells), such as representative storage elements 630, 631, 632, 640, 641, and 642. Each of the storage elements 630, 631, 632, 640, 641, and 642 is coupled to (or is associated with) a bit line and a word line in arrays of memory cells in multiple physical layers over the substrate (e.g., a silicon substrate).

In the example of FIG. 6, each word line includes a plurality of fingers. To illustrate, the word line 620 includes fingers 624, 625, 626, and 627. Each finger may be coupled to more than one bit line. For example, the finger 624 of the word line 620 is coupled to the bit line 610 via the storage element 630 at a first end of the finger 624, and the finger 624 is further coupled to the bit line 611 via the storage element 640 at a second end of the finger 624.

In the example of FIG. 6, each bit line may be coupled to more than one word line. To illustrate, the bit line 610 is coupled to the word line 620 via the storage element 630, and the bit line 610 is further coupled to the word line 622 via the storage element 632.

In operation, the memory die 600 may perform write operations and read operations, such as in response to receiving commands from the controller 330 of FIG. 3. For a write operation, the controller 330 of FIG. 3 may receive data from the accessing device 370 of FIG. 3. The controller 330 may send a command to the memory die 600 to cause the memory die 600 to initiate the write operation. The controller 330 may send redundancy information 605 to be written at storage elements of the memory die 500. The redundancy information 605 may be stored using a page (e.g., a middle page) associated with an "extended" MLC scheme, such as the extended MLC scheme 348 and/or the extended MLC scheme 400. For example, the redundancy information 605 may include the redundancy information 314, any of the ECC information 432, 434, 442, and 444, and/or any of the parity protection information 438, 448. The controller 330 may also send other data (e.g., the codewords 310, 312) to be stored with the redundancy information 605 at a word line of the memory die 600 (e.g., at any of the word lines 620, 621, 622, and 623).

The read/write circuitry 604 may be configured to program the redundancy information 605 to storage elements corresponding to the destination of the redundancy information 605. For example, the read/write circuitry 604 may apply selection signals to selection control lines coupled to the word line drivers 608 and the bit line drivers 606 to cause a write voltage to be applied across a selected storage element of the memory die 600. As an illustrative example, to select the storage element 630, the read/write circuitry 604 may activate the word line drivers 608 and the bit line drivers 606 to drive a programming current (also referred to as a write current) through the storage element 630. To illustrate, a first write current may be used to write a first logical value (e.g., a value corresponding to a high-resistance state) to the storage element 630, and a second write current may be used to write a second logical value (e.g., a value corresponding to a low-resistance state) to the storage element 630. The programming current may be applied by generating a programming voltage across the storage element 630 by applying a first voltage to the bit line 610 and to word lines other than the word line 620 and by applying a second voltage to the word line 620. In a particular embodiment, the first voltage is applied to other bit lines (e.g., the bit lines 614, 615) to reduce leakage current in the memory die 600.

For a read operation, the controller 330 may receive a request from a host device, such as the accessing device 370 of FIG. 3. The controller 330 may issue a command to the memory die 600 specifying one or more physical addresses of the memory die 600, such as one or more physical addresses corresponding to a location of the memory die 600 that stores the redundancy information 605.

The memory die 600 may cause the read/write circuitry 604 to read bits from particular storage elements of the memory die 600, such as by applying selection signals to selection control lines coupled to the word line drivers 608 and the bit line drivers 606 to cause a read voltage to be applied across a selected storage element. For example, to select the storage element 630, the read/write circuitry 604 may activate the word line drivers 608 and the bit line drivers 606 to apply a first voltage (e.g., 0.7 volts (V)) to the bit line 610 and to word lines other than the word line 620. A lower voltage (e.g., 0 V) may be applied to the word line 620. Thus, a read voltage is applied across the storage element 630, and a read current corresponding to the read voltage may be detected at a sense amplifier of the read/write circuitry 604. The read current corresponds (via Ohm's law) to a resistance state of the storage element 630, which corresponds to a logic value stored at the storage element 630.

Figure 7:
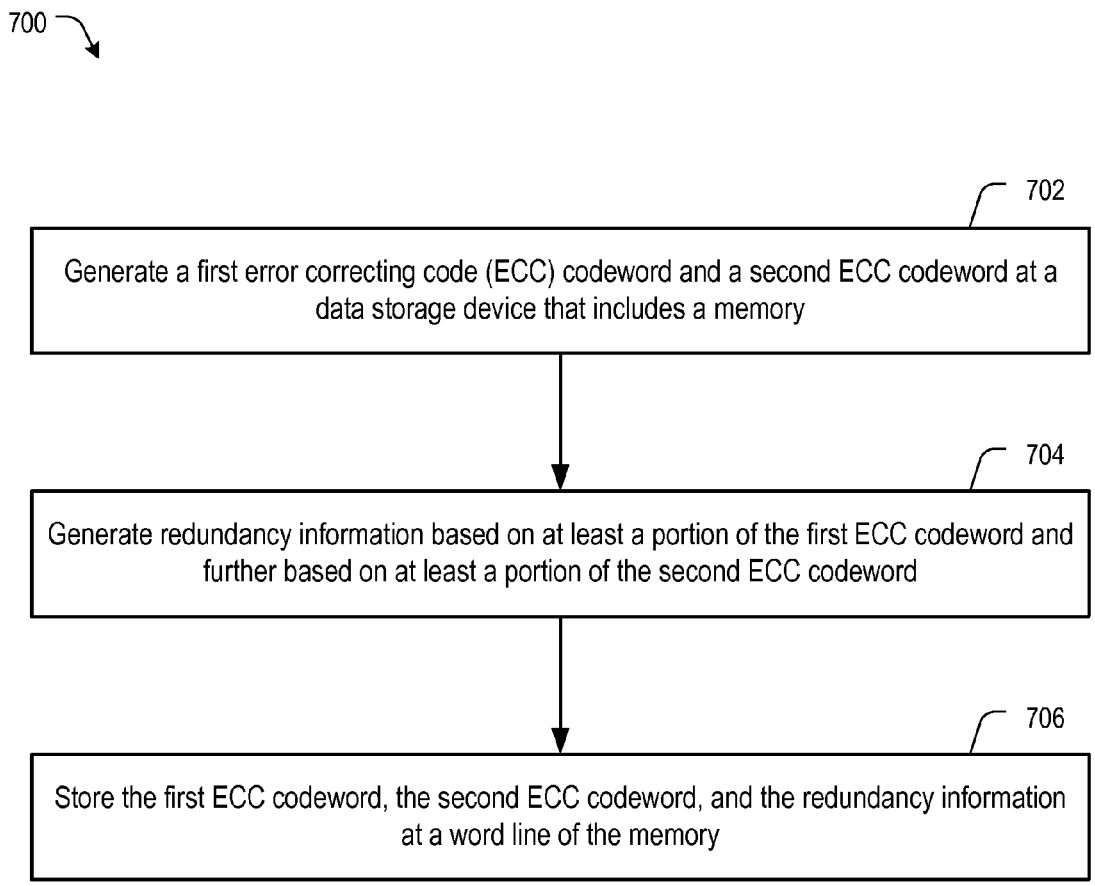
FIG. 7 is a flow diagram of an illustrative embodiment of a method of operation of a data storage device.

Referring to FIG. 7, an illustrative example of a method is depicted and generally designated 700. The method 700 may be performed in a data storage device (e.g., the data storage device 302) that includes a memory (e.g., the memory 304). To illustrate, the memory may have a 3D memory configuration that is monolithically formed in one or more physical levels of arrays of memory cells having an active area above a silicon substrate (e.g., the substrate 594), and the data storage device may also include circuitry associated with operation of the memory cells (e.g., any of the read/write circuitry 504, 604).

The method 700 includes generating a first error correcting code (ECC) codeword and a second ECC codeword at a data storage device that includes a memory, at 702. For example, the data storage device may correspond to the data storage device 302, and the memory may correspond to the memory 304. As another example, the first ECC codeword may correspond to any of the codewords 310, 410, and 420, and the second ECC codeword may correspond to any of codewords 312, 450, and 460.

The method 700 further includes generating redundancy information based on at least a portion of the first ECC codeword and further based on at least a portion of the second ECC codeword, at 704. To illustrate, the redundancy information may include any of the redundancy information 314, 506, and 605, any of the ECC information 432, 434, 442, and 444, and/or any of the parity protection information 438, 448. In an illustrative example, the portion of the first ECC codeword corresponds to either of the portions 416, 426, and the portion of the second ECC codeword correspond to either of the portions 456, 466.

The method 700 further includes storing the first ECC codeword, the second ECC codeword, and the redundancy information at a word line of the memory, at 706. To illustrate, the word line may correspond to one of the word lines 306, 520, 522, 524, 526, 528, 620, 621, 622, and 623, or another word line.

In an illustrative implementation, the first ECC codeword corresponds to a first logical page (e.g., the first logical page 402, such as an upper page) of the word line, the redundancy information corresponds to a second logical page (e.g., the second logical page 404, such as a middle page) of the word line, and the second ECC codeword corresponds to a third logical page (e.g., the third logical page 406, such as a lower page) of the word line. For example, the second logical page may represent the redundancy information and may further represent invalid data (e.g., the invalid data 436 or the invalid data 446), and the first logical page and the third logical page may represent valid data (e.g., any of the codewords 310, 312, 410, 420, 450, and 460). In an illustrative example, the invalid data includes a sequence of logic one bits.

The method 700 may optionally include encoding the portion of the first ECC codeword to generate first ECC information (e.g., the ECC information 432 or 442) and encoding the portion of the second ECC codeword to generate second ECC information (e.g., the ECC information 434 or 444). In this case, the redundancy information may include the first ECC information and the second ECC information. The method 700 may optionally include generating parity protection information based on the first ECC information and further based on the second ECC information. To illustrate, the parity protection information may correspond to any of the parity protection information 438, 448, and the redundancy information may include the parity protection information. In an illustrative implementation, generating the parity protection information includes encoding the first ECC information and encoding the second ECC information.

The method 700 may include sensing the word line to generate a representation of the redundancy information in response to an error rate of one or more of a representation of the first ECC codeword or a representation of the second ECC codeword satisfying a threshold. For example, the representation 320 may be generated in response to an error rate of one or more of the representations 316, 318 satisfying a threshold (e.g., in case of a UECC event). The method 700 may include error correcting one or more of the representation of the first ECC codeword or the representation of the second ECC codeword using the representation of the redundancy information.

In connection with the described examples, a data storage device (e.g., the data storage device 302) includes a memory die (e.g., non-volatile memory die 104 and/or a memory die included in the memory device 303). The memory die includes a non-volatile memory (e.g., the memory 304) and a controller (e.g., the controller 330) coupled to the memory die. The controller is configured to encode data (e.g., the data 372) to generate first encoded data (e.g., any of the codewords 310, 410, and 420) and second encoded data (e.g., any of the codewords 312, 450, and 460). The controller is further configured to generate third data (e.g., any of the redundancy information 314, 506, and 605, any of the ECC information 432, 434, 442, and 444, and/or any of the parity protection information 438, 448) based on at least a subset of the first encoded data (e.g., based on any of the portions 416, 426) and further based on at least a subset of the second encoded data (e.g., based on any of the portions 456, 466). The controller is further configured to store the first encoded data, the second encoded data, and the third data at the non-volatile memory based on an extended MLC scheme (e.g., by storing the first encoded data, the second encoded data, and the third data at one of the word lines 306, 520, 522, 524, 526, 528, 620, 621, 622, and 623 using an extended MLC scheme (e.g., any of the extended MLC schemes 348, 400).

The data storage device may include an ECC engine (e.g., the ECC engine 334) configured to generate the first encoded data and the second encoded data (e.g., by performing an encoding process based on the data 372). The first encoded data may include a first codeword (e.g., any of the codewords 310, 410, and 420), and the second encoded data may include a second codeword (e.g., any of the codewords 312, 450, and 460). To further illustrate, the subset of the first ECC codeword may include a sub-sector of the first ECC codeword (e.g., any of the portions 416, 426), and the subset of the second ECC codeword may include a sub-sector of the second ECC codeword (e.g., any of the portions 456, 466).

In some implementations, the non-volatile memory has a 3D memory configuration that is monolithically formed in one or more physical levels of arrays of memory cells having an active area above a silicon substrate (e.g., the substrate 594). The data storage device may further include circuitry (e.g., any of the read/write circuitry 504, 604) associated with operation of the memory cells.

Although the reliability engine 134 and certain other components described herein are illustrated as block components and described in general terms, such components may include one or more microprocessors, state machines, and/or other circuits configured to enable the data storage device 302 (or one or more components thereof) to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 302 to perform one or more operations described herein.

Alternatively or in addition, one or more aspects of the data storage device 302 may be implemented using a microprocessor or microcontroller programmed (e.g., by executing instructions) to perform operations described herein, such as one or more operations of the method 700. In a particular embodiment, the data storage device 302 includes a processor executing instructions (e.g., firmware) retrieved from the memory 304. Alternatively or in addition, instructions that are executed by the processor may be retrieved from a separate memory location that is not part of the memory 304, such as at a read-only memory (ROM).

It should be appreciated that one or more operations described herein as being performed by the controller 330 may be performed at the memory device 303. As an illustrative example, in-memory" ECC operations (e.g., encoding operations and/or decoding operations) may be performed at the memory device 303 alternatively or in addition to performing such operations at the controller 330.

The data storage device 302 may be coupled to, attached to, or embedded within one or more accessing devices, such as within a housing of the accessing device 370. For example, the data storage device 302 may be embedded within the accessing device 370 in accordance with a Joint Electron Devices Engineering Council (JEDEC) Solid State Technology Association Universal Flash Storage (UFS) configuration. To further illustrate, the data storage device 302 may be integrated within an electronic device (e.g., the accessing device 370), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, the data storage device 302 may be implemented in a portable device configured to be selectively coupled to one or more external devices, such as a host device. For example, the data storage device 302 may be removable from the accessing device 370 (i.e., "removably" coupled to the accessing device 370). As an example, the data storage device 302 may be removably coupled to the accessing device 370 in accordance with a removable universal serial bus (USB) configuration.

The accessing device 370 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The accessing device 370 may communicate via a controller, which may enable the accessing device 370 to communicate with the data storage device 302. The accessing device 370 may operate in compliance with a JEDEC Solid State Technology Association industry specification, such as an embedded MultiMedia Card (eMMC) specification or a Universal Flash Storage (UFS) Host Controller Interface specification. The accessing device 370 may operate in compliance with one or more other specifications, such as a Secure Digital (SD) Host Controller specification as an illustrative example. Alternatively, the accessing device 370 may communicate with the data storage device 302 in accordance with another communication protocol. In some implementations, the system 300, the data storage device 302, or the memory 304 may be integrated within a network-accessible data storage system, such as an enterprise data system, an NAS system, or a cloud data storage system, as illustrative examples.

In some implementations, the data storage device 302 may include a solid state drive (SSD). The data storage device 302 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the data storage device 302 may be coupled to the accessing device 370 via a network. For example, the network may include a data center storage system network, an enterprise storage system network, a storage area network, a cloud storage network, a local area network (LAN), a wide area network (WAN), the Internet, and/or another network.

To further illustrate, the data storage device 302 may be configured to be coupled to the accessing device 370 as embedded memory, such as in connection with an embedded MultiMedia Card (eMMC®) (trademark of JEDEC Solid State Technology Association, Arlington, Va.) configuration, as an illustrative example. The data storage device 302 may correspond to an eMMC device. As another example, the data storage device 302 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 302 may operate in compliance with a JEDEC industry specification. For example, the data storage device 302 may operate in compliance with a JEDEC eMMC specification, a JEDEC Universal Flash Storage (UFS) specification, one or more other specifications, or a combination thereof.

The memory 304 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory 304 may include another type of memory. In a particular embodiment, the data storage device 302 is indirectly coupled to an accessing device (e.g., the accessing device 370) via a network. For example, the data storage device 302 may be a network-attached storage (NAS) device or a component (e.g., a solid-state drive (SSD) component) of a data center storage system, an enterprise storage system, or a storage area network. The memory 304 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
in a data storage device that includes a memory, performing:
generating a first error correcting code (ECC) codeword and a second ECC codeword; and
based on detecting an indication that a physical page of the memory is to store redundancy information:
adjusting a configuration associated with the physical page from a first scheme that stores user data to a logical page of the physical page to an extended multi-level cell (MLC) scheme that stores the redundancy information to the logical page;
generating the redundancy information based on at least a portion of the first ECC codeword and further based on at least a portion of the second ECC codeword; and
storing the first ECC codeword, the second ECC codeword, and the redundancy information at the physical page.

2. The method of claim 1, wherein the first ECC codeword corresponds to a first logical page to be stored at the physical page, wherein the logical page corresponds to a second logical page at the physical page, and wherein the second ECC codeword corresponds to a third logical page to be stored at the physical page.

3. The method of claim 2, wherein the second logical page represents the redundancy information and further represents invalid data, and wherein the first logical page and the second logical page represent valid data.

4. The method of claim 3, wherein the invalid data includes a sequence of logic one bits.

5. The method of claim 1, further comprising sensing the physical page to generate a representation of the redundancy information in response to an error rate of one or more of a representation of the first ECC codeword or a representation of the second ECC codeword satisfying a threshold.

6. The method of claim 5, further comprising error correcting one or more of the representation of the first ECC codeword or the representation of the second ECC codeword using the representation of the redundancy information.

7. The method of claim 1, wherein the memory has a three-dimensional (3D) memory configuration that is monolithically formed in one or more physical levels of arrays of memory cells, the one or more physical levels of arrays of memory cells having an active area disposed above a silicon substrate, and wherein the data storage device further includes circuitry associated with operation of the memory cells.

8. A data storage device comprising:
a memory die, the memory die including a non-volatile memory; and
a controller coupled to the memory die, wherein the controller is configured to, based on detecting an indication that a particular region of the non-volatile memory is to store redundancy information:
adjust a configuration associated with the particular region from a first technique that stores user data to a logical page of the particular region to an extended multi-level cell (MLC) technique that stores the redundancy information to the logical page;
generate the redundancy information based on at least a subset of first encoded data and further based on at least a subset of second encoded data; and
store the first encoded data, the second encoded data, and the redundancy information at the particular region.

9. The data storage device of claim 8, wherein the controller includes an error correcting code (ECC) engine configured to generate the first encoded data and the second encoded data.

10. The data storage device of claim 9, wherein the first encoded data includes a first ECC codeword, and wherein the second encoded data includes a second ECC codeword.

11. The data storage device of claim 9, wherein the subset of the first encoded data includes a sub-sector of a first ECC codeword, and wherein the subset of the second encoded data includes a sub-sector of a second ECC codeword.

12. The data storage device of claim 8, wherein the non-volatile memory has a three-dimensional (3D) memory configuration that is monolithically formed in one or more physical levels of arrays of memory cells, the one or more physical levels of arrays of memory cells having an active area above a silicon substrate, and further comprising circuitry associated with operation of the memory cells.

13. An apparatus comprising:
   means for storing data; and
   means for controlling the means for storing data, the means for controlling configured to, based on detecting an indication that a physical page of the means for storing data is to store redundancy information:
      adjust a configuration associated with the physical page from a first scheme that stores user data to a logical page of the physical page to an extended multi-level cell (MLC) scheme that stores the redundancy information to the logical page;
      generate the redundancy information based on a first error correcting code (ECC) codeword and a second ECC codeword; and
      send the first ECC codeword, the second ECC codeword, and the redundancy information to the means for storing data to be stored at the physical page.

14. The apparatus of claim 13, wherein the first ECC codeword corresponds to a lower page of the physical page, wherein the second ECC codeword corresponds to an upper page of the physical page, and wherein the logical page corresponds to a middle page of the physical page.

15. The apparatus of claim 14, wherein the middle page represents the redundancy information and further represents invalid data, and wherein the upper page and the lower page represent valid data.

16. The apparatus of claim 15, wherein the invalid data includes a sequence of logic one bits.

17. The apparatus of claim 13, wherein the means for storing data has a three-dimensional (3D) memory configuration that is monolithically formed in one or more physical levels of arrays of memory cells, the one or more physical levels of arrays of memory cells having an active area above a silicon substrate, and further comprising circuitry associated with operation of the memory cells.

18. The method of claim 1, wherein the indication corresponds to one or more of a health level associated with the physical page, a location of the physical page in a memory die of the data storage device, or a number of program/erase cycles associated with the physical page.

19. The method of claim 1, further comprising:
   in response to detecting the indication, adjusting an entry of a table of the data storage device from indicating the first scheme to indicating the extended MLC scheme.

20. The method of claim 19, wherein the table further indicates that a second storage region of the data storage device is associated with the first scheme, and wherein the extended MLC scheme is applied to the physical page independently of the second storage region.

* * * * *